(12) United States Patent
Kozlowski et al.

(10) Patent No.: US 6,504,141 B1
(45) Date of Patent: Jan. 7, 2003

(54) ADAPTIVE AMPLIFIER CIRCUIT WITH ENHANCED DYNAMIC RANGE

(75) Inventors: Lester J. Kozlowski, Simi Valley, CA (US); William E. Tennant, Thousand Oaks, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/675,483

(22) Filed: Sep. 29, 2000

(51) Int. Cl.[7] .................. G02B 21/00; H04N 5/335; N01L 29/78
(52) U.S. Cl. .................. 250/214 A; 250/208.1; 250/338.4
(58) Field of Search .................. 250/208.1, 208.2, 250/214 A, 214 R, 338.1, 338.4, 339.02, 370.01, 370.14; 348/300, 301, 308

(56) References Cited

U.S. PATENT DOCUMENTS

| | | | |
|---|---|---|---|
| 4,249,122 A | 2/1981 | Widlar | |
| 4,463,383 A | 7/1984 | Sonoda et al. | |
| 4,466,018 A | 8/1984 | Sonoda et al. | |
| 4,676,761 A | 6/1987 | Poujois | |
| 4,794,247 A | 12/1988 | Stineman et al. | |
| 5,003,565 A | * 3/1991 | Yoshida | 377/60 |
| 5,043,820 A | 8/1991 | Wyles et al. | |
| 5,055,667 A | 10/1991 | Sayag | |
| 5,083,016 A | 1/1992 | Wyles et al. | |
| 5,128,534 A | 7/1992 | Wyles et al. | |
| 5,146,302 A | 9/1992 | Kumada | |
| 5,296,696 A | 3/1994 | Uno | |
| 5,345,266 A | 9/1994 | Denyer et al. | |
| RE34,802 E | 11/1994 | Sayag et al. | |
| 5,382,977 A | 1/1995 | Kozlowski et al. | |
| RE34,908 E | 4/1995 | Wyles et al. | |
| 5,471,515 A | 11/1995 | Fossum et al. | |
| 5,541,402 A | 7/1996 | Ackland et al. | |
| 5,576,763 A | 11/1996 | Ackland et al. | |
| 5,587,596 A | 12/1996 | Chi et al. | |
| 5,608,243 A | 3/1997 | Chi et al. | |
| 5,627,112 A | 5/1997 | Tennant et al. | |
| 5,665,959 A | 9/1997 | Fossum et al. | |
| 5,929,434 A | 7/1999 | Kozlowski et al. | |
| 5,933,190 A | 8/1999 | Dierickx et al. | |
| 6,064,431 A | 5/2000 | Ueno | |
| 6,094,159 A | * 7/2000 | Osterfeld et al. | 342/70 |
| 6,288,387 B1 | * 9/2001 | Black et al. | 250/214 A |

FOREIGN PATENT DOCUMENTS

WO    WO 02/29895 A1  * 4/2002

OTHER PUBLICATIONS

R.H. Dyck and G.P. Weckler, "Integrated Arrays Of Silicon Photodetectors For Image Sensing", IEEE Trans. Electron Devices, ED–15, Apr. 1968, pp. 196–201.

J.D. Plummer and J.D. Meindl, "MOS Electronics For A portable Reading Aid For The Blind", IEEE J. Solid–State Circuits, SC–7, Apr. 1972, pp. 111–119.

(List continued on next page.)

Primary Examiner—Stephone B. Allen
(74) Attorney, Agent, or Firm—Crosby, Heafey, Roach & May

(57) ABSTRACT

An adaptive amplifier circuit with minimal excess noise and a linear charge-handling capacity exceeding $10^9$ electrons to enable high-quality imaging at long wavelength infrared backgrounds and video frame rates with enhanced dynamic range is disclosed. An integration capacitor stores a charge produced from a photodetector. An adaptive skimming circuit skims off excess charge during integration of the charge on the integration capacitor. A switched-capacitor low pass filter provides enhanced dynamic range.

11 Claims, 4 Drawing Sheets

OTHER PUBLICATIONS

N. Koikke, I. Takemoto,K. Satoh, S. Hanamura, S. Nagahara and M. Kubo, "MOS Area Sensor: Part I—Design Consideration And Performance Of an n–p–n Structure 484 × 384 Element Color MOS Imager", IEEE Trans Electron Devices, ED–27 (8), Aug. 1980, pp. 1676–1681.

S. Ohba, M. Nakai, H. Ando, S. Hanamura, S. Shimada, K. Satoh, K. Takahashi, M. Kubo and T. Fujita, "MOS Area Sensor: Part II—Low–Noise MOS Area Sensor With Antiblooming Photodiodes", IEEE Trans. Electron Devices, ED–27 (8) Aug. 1980, pp. 1682–1687.

EG&G Reticon Sales Catalog, *Image Sensing and Solid State Camera Products 1994/1995.* Solid State Image Sensor Array Specification For Part No.: RA0256B.

EG&G Reticon Sales Catalog, *Imaging Sensing and Solid State Camera Products 1994/1995. High–Speed*Solid State Image Sensor Array Specification For Part No. RA2568N.

EG&G Reticon Sales Catalog, *Image Sensing and Solid State Camera Products 1994/1995.* Solid State Sensor Arrays Specification For Part Nos.: RA0100A/RA0128N.

H. Ando, S. Ohba, M. Nakai, T. Ozaki, M. Ozawa, K. Ikeda, T. Masuhara, T. Imaide, I. Takemoto, T. Suzuki and T. Fukita, "Design Consideration And Performance Of A New MOS Imaging Device, "IEEE Trans. On Elec. Dev., ED–32 (8), Aug. 1985, pp. 1484–1489.

N. Tanaka, T. Ohmi and Y. Nakamura, "A Novel Bipolar Imaging Device With Self–Noise Reduction Capability", IEEE Trans. Elec. Dev., 36 (1), Jan. 1989, pp. 31–38.

G.P. Weckler, "Storage Mode Operation Of A Phototransistor And Its Adaptation To Integrated Arrays Foe Image Detection", IEDM, Oct. 1996. (Abstract Only—No known paper available from professional document delivery services).

N. Tanaka, T. Ohmi, Y. Nakamura and S. Matsumoto, "A Low–Noise Bi–CMOS Linear Imager Sensor With Auto–Focusing Function", IEEE Trans. Elec. Dev., 36 (1), Jan. 1989, pp. 39–45.

N. Tanaka, S. Hashimoto, M. Shinohara, S. Sugawa, m. Morishita, S. Matsumora, Y. Nakamura and T. Ohmi, A 310k Pixel Bipolar Imager (BASIS), ISSCC 1989.

G.P. Weckler, "Charge Storage Lights The Way For Solid–State Image Sensors", Electronics, May 1, 1967, pp. 75–78.

G.P. Weckler, "Operation of p–n Junction Photodetectors In A Photon Flux Integrating Mode", IEEE Journal Of Solid State Circuits, vol. SC–2, No. 3, Sep. 1967, pp. 65–73.

G.P. Weckler and R.H. Dyck, "Integrated Arrays Of Silicon Photodetectors For Image Sensing", WESCON, Aug. 22–25, 1967, pp. 1–8.

L.J. Kozlowski, J. Luo, W.E. Kleinhans and T. Lui, "Comparison Of Passive And Active Pixel Schemes For CMOS Visible Imagers", SPIE, vol. 3360, Apr. 1998.

Ming–Jer Chin, Yen–Bin Gu, Terry Wu, Po–Chin Hsu and Tsung–Hann Liu, "Weak Inversion Charge Injection In Analog MOS Switches", IEEE, Journal Of Solid–State Circuits, vol. 30, No. 5, May 1995, pp. 604–606.

Peter W. Fry, Peter J. W. Noble and Robert J. Rycroft, "Fixed–Pattern Noise In Photomatrices", IEEE Journal Of Solid–State Circuits, vol. SC–5, No. 5, Oct. 1970, pp. 250–254.

Degrauwe, et al., "A Microppower CMOS–Instrumentation Amplifier", IEEE Journal Of Solid–State Circuits, vol. SC–20, No. 3 Jun. 1985, pp. 805–807.

Letter Dated Jul. 31, 1998, From Gene Weckler, RAD–ICON IMAGING CORP., addressed to Mark Wettler.

Chamberlin, et al., "A Novel Wide Dynamic Range Silicon Photodetector And Linear Imaging Array", IEEE Transactions On Electron Devices, Vo. ED–31, No. 2, Feb. 1984, pp. 175–182.

L.J. Kozlowski, D. Standley, J. Luo. A Tomasini, A. Gallagher, R. Mann, B.C. Hsieh, T. Liu and W.E. Kleinhans, "Theoretical Basis And Experimental Confirmation: Why A CMOS Imager Is Superior To A CD", SPIE Conference On Infrared Technology And Applications XXV, Orlando, Fla, Apr. 1999, vol. 369, pp. 388–396.

* cited by examiner

ADAPTIVE AMPLIFIER CIRCUIT WITH ENHANCED DYNAMIC RANGE

The present application is related to U.S. patent application Ser. No. 09/675,278, entitled "SELF-ADJUSTING ADAPTIVE MINIMAL NOISE INPUT AMPLIFIER CIRCUIT", filed Sep. 29, 2000; and is also related to U.S. patent application Ser. No. 09/675,487, entitled "HIGH GAIN DETECTOR AMPLIFIER WITH ENHANCED DYNAMIC RANGE FOR SINGLE PHOTON READ-OUT OF PHOTODETECTORS", filed Sep. 29, 2000; the disclosures of which are herein incorporated by reference.

BACKGROUND OF THE INVENTION

1. Field of the Invention

The present invention relates to interface circuits for focal plane arrays (FPAs) and, specifically, to an adaptive amplifier circuit that uniquely provides high charge-handling capacity for coupling long wavelength IR detectors to multiplexing readouts with both maximum sensitivity and enhanced dynamic range.

2. Description of the Related Art

Infrared sensors transform incident radiant signals in the near infrared (NIR; $\lambda$=0.8–2 $\mu$m), short wavelength IR (SWIR;$\lambda$=2.0–2.5 $\mu$m), medium wavelength IR (MWIR;$\lambda$=2.5–5 $\mu$m), and long wavelength IR (LWIR;$\lambda$=5–30 $\mu$m) bands into electrical signals that are used for data collection, processing, storage and display, such as real-time video. For high-quality imaging of various scenes without concern for ambient light, the MWIR and LWIR bands are often used interchangeably. However, MWIR infrared detector systems typically require sophisticated signal processing algorithms to accommodate the large dynamic changes in background information that result from the relatively high contrast and large solar influence of the scene radiation. Detectors operating in the preferred long wavelength infrared (LWIR) spectral band, on the other hand, can attain the same or greater thermal sensitivity with reduced signal processing complexity. This is especially true in the 8 to 12 $\mu$m wavelength atmospheric window, which is optimum for imaging many terrestrial scenes. As a result, infrared detection and tracking can be accomplished using smaller, more cost-effective sensors having LWIR focal plane arrays.

Unfortunately, LWIR focal plane arrays and multiplexing readout circuits have practical design constraints that severely limit system performance. The result is degradation in signal-to-noise ratio by >10x below the theoretical limit. In the readout portion of a focal plane array, each pixel has an preamplifier to couple the signal from each detector into the respective unit cell. The corresponding readout site must perform several functions that are difficult to simultaneously incorporate in the small amount of "real estate" typically available on such a signal-processing chip. Ideally, each detector/amplifier cell of an FPA should include the following: 1) a detector interface stage that provides low impedance at a uniform operating bias; 2) an integration capacitor with large charge-handling capability; 3) a stage for uniform suppression of the background if integration capacity is inadequate; 4) facility for low-power multiplexing and reset; 5) an output buffer capable of driving the bus line capacitance for subsequent multiplexing of the electrical signal at video rates; and 6) a sufficiently large transimpedance to enable sensor-limited rather than camera-noise-limited performance; i.e., the output-referred noise level of the shot noise at the lowest background must be easily measurable by conventional camera electronics.

Staring LWIR FPAs in formats up to 1024 by 1024 have now been demonstrated in the prior art. However, these LWIR devices are typically coupled to conventional MWIR readout circuits, which have several deficiencies that compromise system performance. The limited charge-handling capacity, for example, supports camera sensitivity no better than that achieved by a typical MWIR FPA. This obviates a key benefit of operation in the LWIR spectral band. Moreover, prior art devices limit capability for reducing pixel pitch and increasing pixel density. If the pixel pitch and detector/amplifier cell real estate are reduced in prior art devices, the performance limitations are further exacerbated.

Given the current photolithographic state-of-the-art and the limited chip area, there is insufficient detector/amplifier cell real estate to integrate even the most important features including the ability to directly handle all the charge that can be generated during the full frame time. Nevertheless, because small cells are necessary for FPAs with high pixel counts that can be used with compact optics, the readout circuit must be integrated in as little chip real estate as possible. Thus, there is a need for a compact amplifier having characteristics that are better optimized for use in staring LWIR FPAs.

U.S. Pat. No. 5,128,534 teaches the technique of biasing a capacitor with a variable voltage source to increase the amount of charge that can be effectively integrated on an integrating capacitor (of the typical size that can readily fit into a standard unit cell). This improves the signal-to-noise ratio of the focal plane array by clipping excess signal. The enhancement in capacity is a trade-off for a nonlinear dynamic range; this non-linearity is not optimum for LWIR imaging since the signal of interest is a small fraction of the background radiation.

U.S. Pat. No. 5,055,667 and U.S. Pat. No. RE34,802 also disclose nonlinear techniques for visible CCD imagers. These methods control the dynamic range of a CCD in a manner somewhat analogous to U.S. Pat. No. 5,128,534 by providing a sink region to dispose of excess charge from the photogate region by clipping any signal above the potential set by a control gate where the potential can be similarly modulated during the exposure period. Such predetermined fluctuation can facilitate various transfer functions including logarithmic behavior. Such characteristics are not optimum for LWIR imaging.

U.S. Pat. No. 5,382,977 proposes an alternative that effectively enhances the linear charge-handling capacity via electronic scanning. Since the total charges accumulated during a typical frame time ($\frac{1}{60}^{th}$ second) can exceed $10^{10}$ carriers while the typical integration capacitor can only handle on the order of mid-$10^7$ carriers, this method accepts the ~100x disparity between the two to extend the linear capacity to approximately $10^9$ carriers. Unfortunately, all the available charges for each frame time are not used so maximum sensitivity is impossible. The inefficiency translates to a proportional reduction in the effective quantum efficiency of the imaging sensor.

U.S. Pat. No. 5,146,302 again teaches skimming in a CCD to enhance the linear charge-handling capacity. To improve efficacy, a sampling circuit comprising a tandem input is used to generate a prescribed skimming voltage. However, the non-uniformity in threshold voltages between the input gates of the main input and the sampling input sets a limit on the amount of charge that can be skimmed. This limit is typically no more than 3 times the instantaneous charge-handling capacity. The linear capacity is thus effectively increased to the order of $10^8$ carriers. A further improvement of two orders of magnitude is still needed.

Finally, U.S. Pat. No. 6,064,431 discloses a circuit for skimming to linearly enhance the effective charge-handling capacity. This circuit, shown in FIG. 1, provides automatic control of the skimming charges to be transferred. Here the capability for predetermined sinking of excess signal, as taught by U.S. patents '534, '667 and '802 noted above, is combined with conventional skimming, as taught by the '302 patent, to further enhance the effective charge-handling capacity. In principle, the 2× to 3× enhancement of '302 patent can be enhanced to yield several orders of magnitude enhancement in charge-handling capacity. Unfortunately, the improvement is again non-linear and thus not optimum for infrared applications.

SUMMARY OF THE INVENTION

In general, the present invention provides an adaptive amplifier circuit, having minimal excess noise and a linear charge-handling capacity exceeding $10^{10}$ electrons, to enable high-quality imaging at long wavelength infrared backgrounds and video frame rates. The present invention supports various types of photovoltaic and photoconductive detectors, and largely reduces the fixed pattern noise relative to the prior art. Since the circuit does not discriminate between dark current and photocurrent, it can also be used to operate MWIR detectors at elevated operating temperatures including room temperature. The adaptive detector amplifier circuit comprises either impedance-buffered or direct injection detector interface with self-nulling skimming of the background signal and self-adapting offset suppression. An adaptive skimming circuit skims off excess charge during the integration of charge on an integration capacitor. These features are integrated in conjunction with a compact low-pass filter at the pixel output to recover the instantaneous dynamic range. Such recovery is necessary since the skimming serves to boost the noise level at the expense of dynamic range. The net outcome is LWIR FPA sensitivity commensurate with a charge-handling capacity of $10^{10}$ carriers and a dynamic range in excess of 14 bits. In the context of LWIR imaging, for example, the noise equivalent temperature difference that is achieved is on the order of 0.001 K, which is well over an order of magnitude better than the LWIR staring FPA state-of-the-art. The front-end provides very uniform skimming without significantly increasing the read noise.

This solution fits into the typical pixel pitches normally used for single-photon detection ($\geq 20$ μm) to amplify the photo-generated signal for subsequent processing or display. The resulting video has large margin over the background noise of the camera electronics.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide to a self-adjusting adaptive amplifier circuit that uniquely provides high charge-handling capacity for optimally coupling IR detectors to multiplexing readouts with both maximum sensitivity and enhanced dynamic range in high-density staring FPAs. Any and all such modifications, equivalents and alternatives are intended to fall within the spirit and scope of the present invention.

The present invention provides a high-performance detector amplifier to support each pixel of an infrared focal plane array. According to the various embodiments of the present invention, one benefit of the various features of the present invention is the simultaneous achievement of very high sensitivity with extended dynamic range of at least 14 bits. A second benefit is an output signal that is rich with signal content rather than parasitic nonuniformities. The usable dynamic range of most high-performance thermal images is limited by the fixed pattern noise arising from offset variations in the detector and amplifier.

Figure 1:
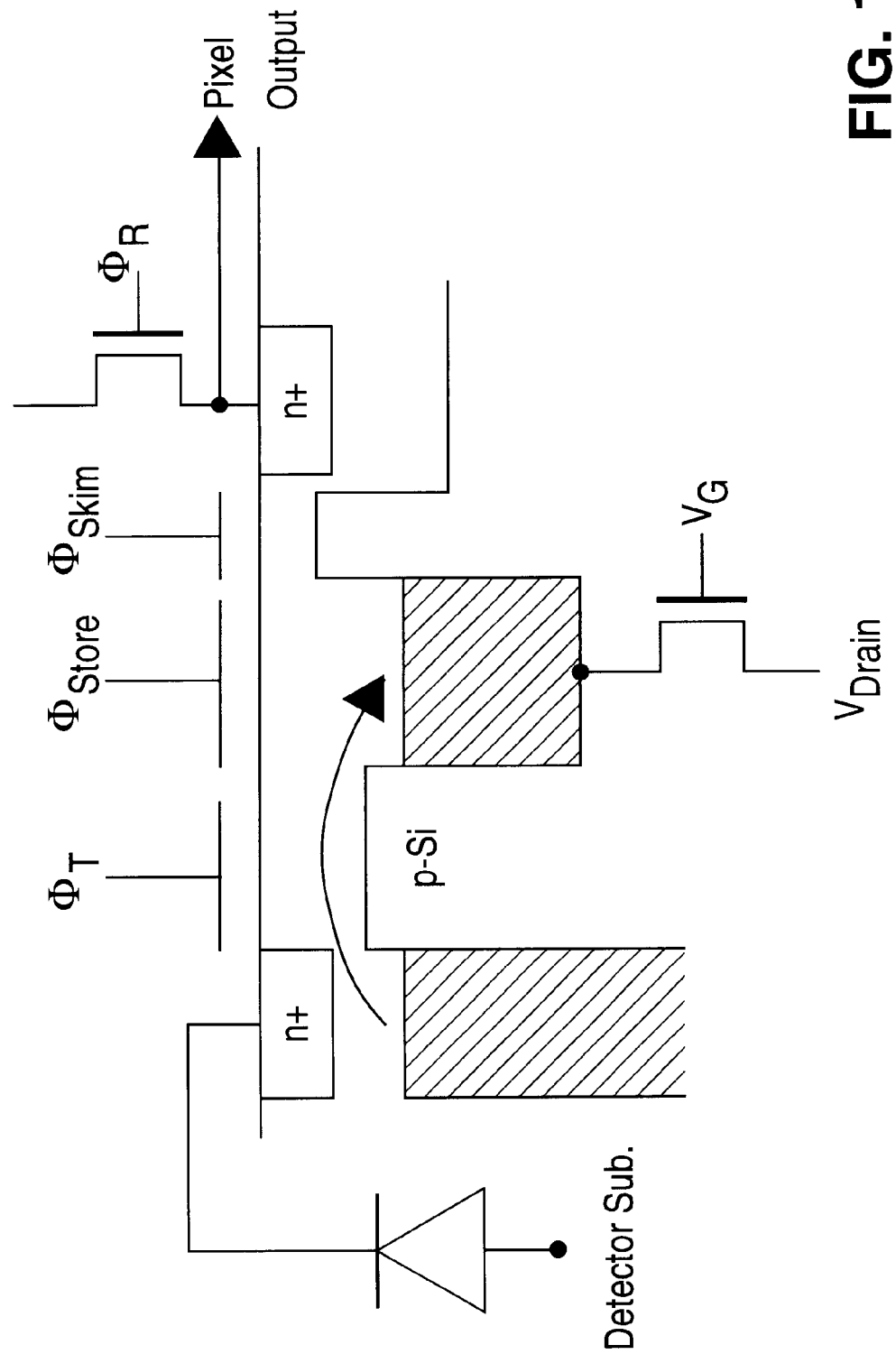
FIG. 1 is a schematic diagram of a prior art technique for enhancing dynamic range as shown in U.S. Pat. No. 6,064,431.
Figure 2:
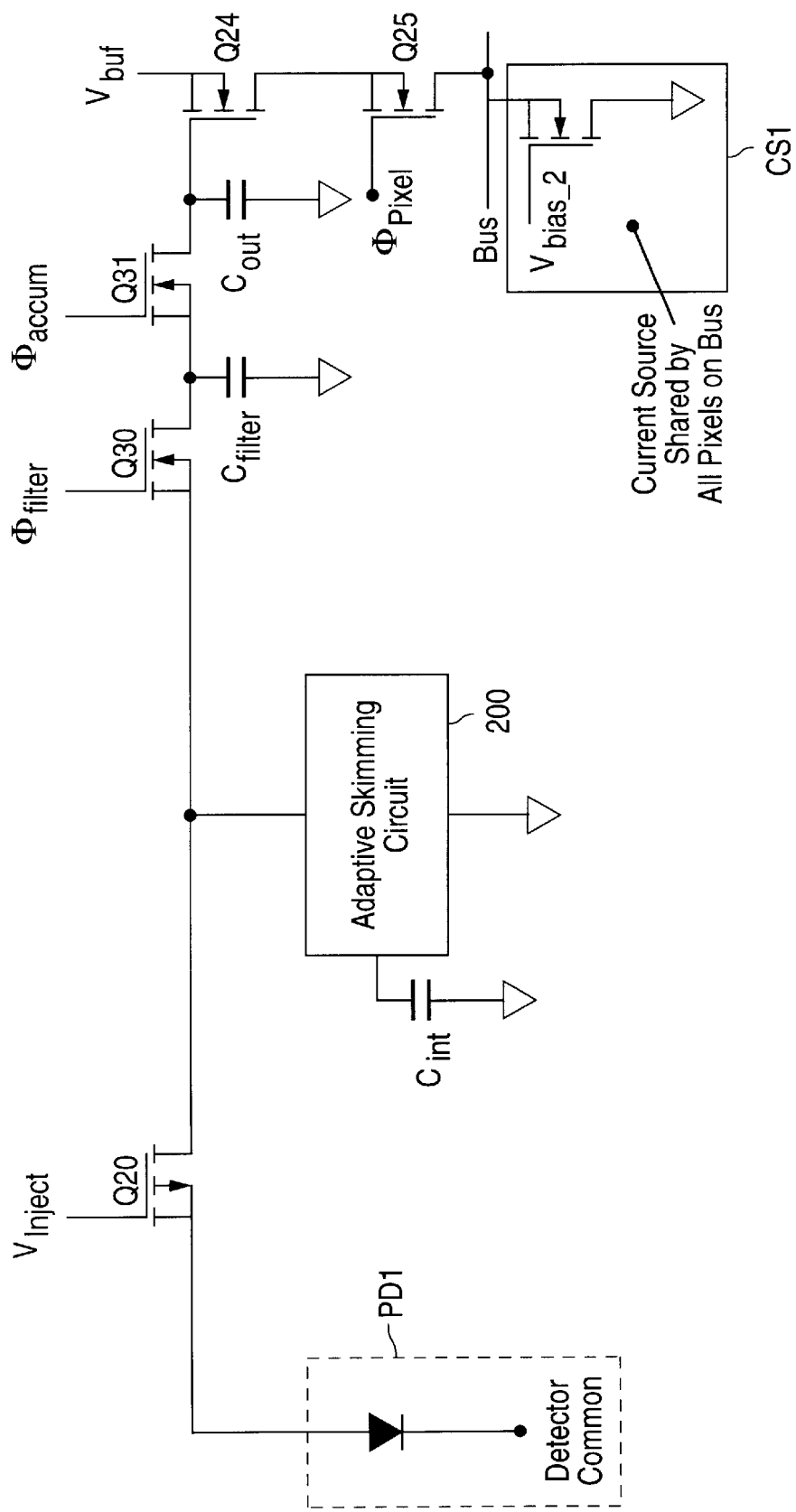
FIG. 2 is a schematic diagram for a preferred embodiment of an enhanced adaptive amplifier circuit with minimal noise input.

A first embodiment of the present invention is shown in FIG. 2. The amplifier circuit 2 comprises a detector PD1 that is directly coupled to the source of an input transistor Q20. The gate of Q20 is adjusted to set the detector bias and the source of Q20 is modulated by the photo-generated signal from PD1. Minority carriers are injected into an integration capacitor $C_{int}$ in the adaptive skimming circuit, where they are accumulated for subsequent readout. The integration capacitor $C_{int}$ is preferably formed using a MOSFET having its source and drain connected. The adaptive skimming circuit 200 skims off excess charge during the integration of charge on an integration capacitor. A suitable adaptive skimming circuit is disclosed in, for example, U.S. patent application Ser. No. 09/675,278, entitled "SELF-ADJUSTING ADAPTIVE MINIMAL NOISE INPUT AMPLIFIER CIRCUIT", filed Sep. 29, 2000, the disclosure of which is herein incorporated by reference.

An integration capacitor $C_{int}$ in the adaptive skimming circuit 200 is connected to a switched-capacitor low-pass filter comprising transistors Q30 and Q31, and capacitors $C_{filter}$ and $C_{out}$. The signal $\phi_{filter}$, which is a clock that essentially parses the frame time into N integration periods, is applied to the gate of Q30 to successively sample the signal charges integrated in $C_{int}$ onto $C_{filter}$. The charge on $C_{filter}$ is then shared over to the output capacitor $C_{out}$. Since $C_{filter}$ is relatively small, a smaller fraction of the charge is stored onto $C_{out}$. This cycle is repeated N times during the frame time so that the cumulative voltage on $C_{out}$ exponentially reaches equilibrium. While the signal builds exponentially as described, the associated noise also adds exponentially, but in quadrature. The enhancement in linear charge-handling capacity for this stage relative to integration on $C_{int}$ over a single epoch without skimming is consequently:

$$N_{boost_2} = \frac{1-\eta^N}{1+\eta^N} \cdot \frac{1+\eta}{1-\eta}$$

where N is the number of cycles. η is an efficiency factor described by the equation:

$$\eta = \frac{C_{filter}}{C_{filter}+C_{int}} + \frac{C_{out}}{C_{out}+C_{filter}} - \frac{C_{filter}}{C_{filter}+C_{int}} \cdot \frac{C_{out}}{C_{out}+C_{filter}}$$

The total enhancement in charge-handling capacity effected by the entire circuit is multiplicative and becomes:

$$N_{boost,total} = N_{boost_1} \cdot N_{boost_2}$$

$$\geq 10 \cdot \frac{1-\eta^N}{1+\eta^N} \cdot \frac{1+\eta}{1-\eta}$$

Since $C_{int}$ and $C_{out}$ are on the order of 1 pF and $C_{filter}$ is optimally chosen to be about an order of magnitude smaller, η>0.9 is achieved in practice. Assuming N=25, a minimum charge-handling capacity enhancement factor well in excess of 100× is provided by the present invention.

A source follower transistor Q24 buffers the signal and an access transistor Q25 supplies the signal to the bus. A common current source CS1 may be connected to the bus and shared by all the pixels on the bus.

Figure 3:
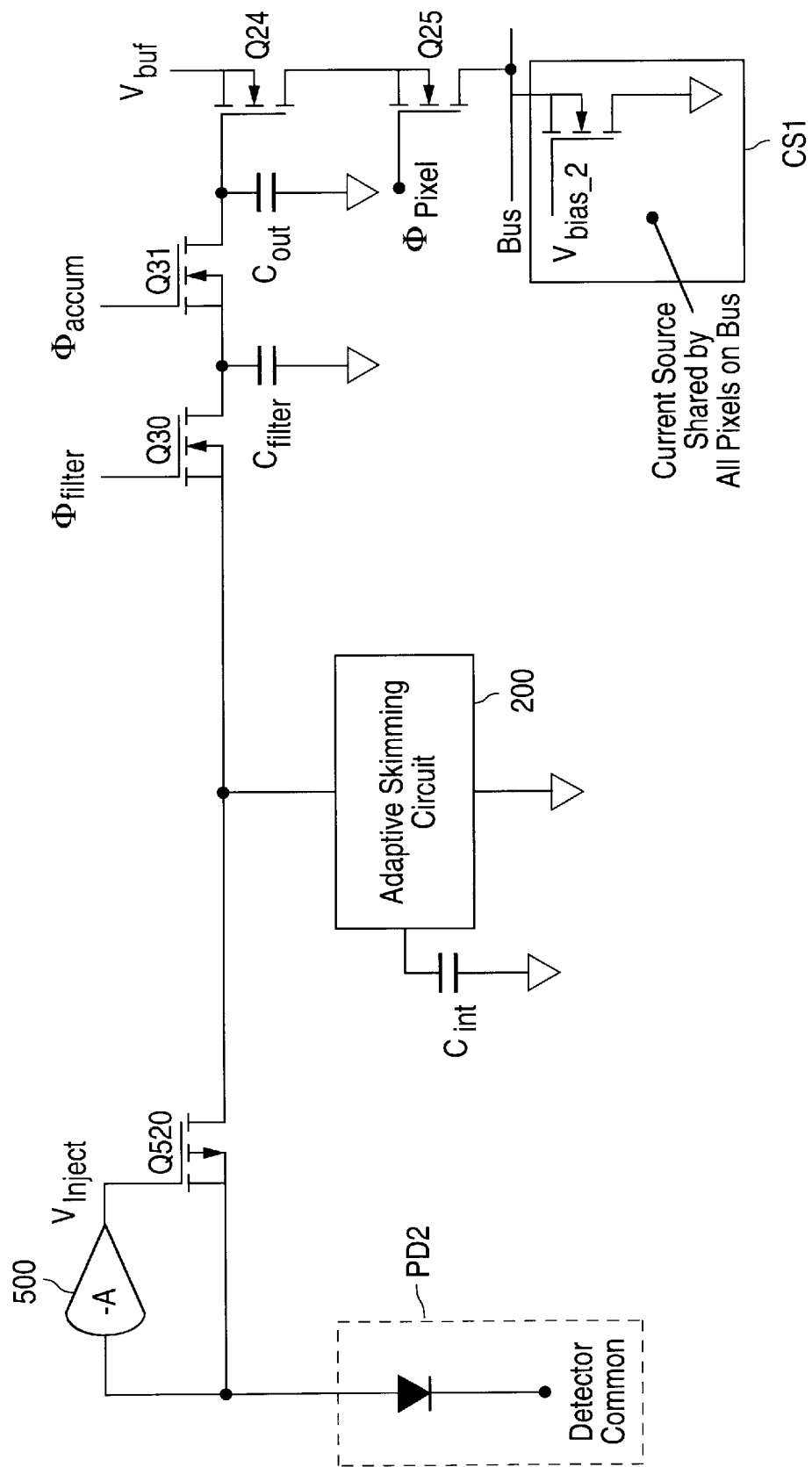
FIG. 3 is a schematic diagram for an adaptive amplifier circuit with minimal noise input and impedance-buffered interface to the photodetector.

The key aspects of the present self-adjusting adaptive input with minimal noise circuit are applicable to other types of circuits used for interfacing infrared detectors. For example, FIG. 3 is a schematic circuit of an alternative embodiment for use with lower impedance detectors PD2, such as those fabricated in the HgCdTe ternary system for operation at cutoff wavelengths beyond 12 μm at operating temperatures above 60 K. The negative feedback provided by amplifier 500 enhances the injection efficiency of detector current into the integration capacitor $C_{int}$ by decreasing the input impedance of source-modulated transistor Q520. The inverting amplifier can be of many types known to those of ordinary skill in the art, such as a basic CMOS inverter, a basic differential amplifier, or a folded cascode differential amplifier, among others. Regardless, the amplifier will also luminesce and must be optically shielded for proper operation of the skimming input circuit.

Figure 4:
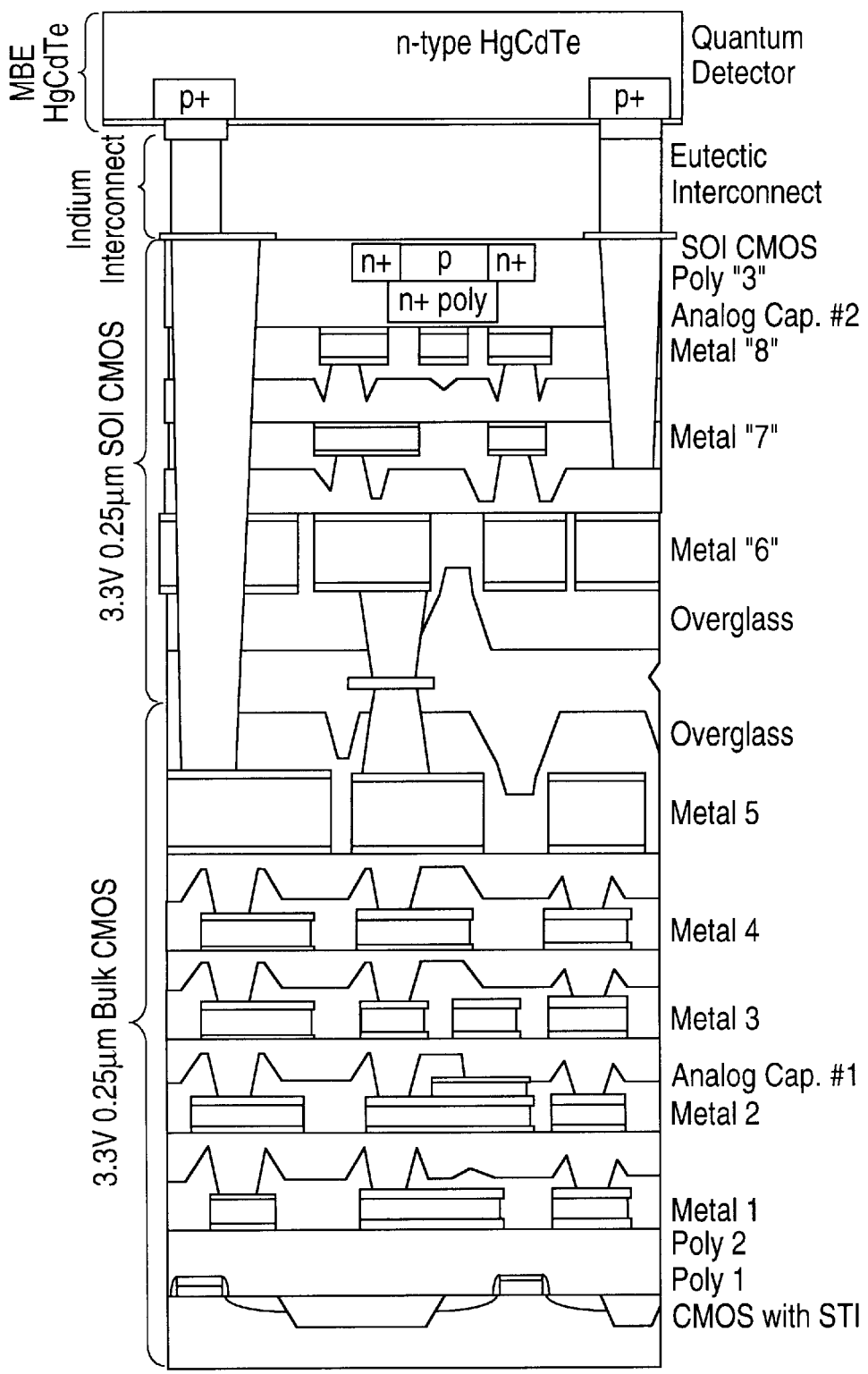
FIG. 4 is a cross-section plan for an alternative embodiment of the invention to facilitate highest performance by vertically integrating the amplifier circuit.

To incorporate the desired capacitances of the present invention, pixel real estate can still be at a premium as pixel pitches reduce to 20 μm and lower. In this case, it is best to use vertical integration. FIG. 4 is a cross-section plan where the vertical integration is achieved by combining the circuit integration provided by bulk CMOS with SOI CMOS. A part of the circuit is incorporated in the bulk CMOS constituent. The other part of the circuit is incorporated in the SOI CMOS wafer. The SOI CMOS wafer is subsequently filcher processed to remove the handle wafer. The thinned SOI material is subsequently transferred by thin-film transfer such as taught in U.S. Pat. No. 5,627,112, herein incorporated by reference.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A photodetector amplifier circuit comprising:
    a photodetector;
    an input transistor connected to the photodetector;
    an integration capacitor;
    an adaptive skimming circuit connected to the integration capacitor; and
    a switched-capacitor low-pass filter connected to the output of the input transistor.

2. The circuit of claim 1, further comprising a source follower transistor connected to the output of the input transistor.

3. The circuit of claim 2, further comprising an access transistor connected between the input transistor and a bus.

4. The circuit of claim 1, wherein the switched-capacitor low-pass filter comprises:
    first and second transistors connected to the output of the input transistor;
    a filter capacitor having one node connected to the first and second transistors; and
    an output capacitor having a node connected to the second transistor and an output node.

5. The circuit of claim 4, further comprising a negative feedback amplifier connected between the photodetector and the input transistor, wherein the photodetector is a low impedance detector.

6. A focal plane array (FPA) having a plurality of pixel cells, each pixel cell comprising:
    an input transistor;
    a photodetector coupled to the source of the input transistor;
    an adaptive skimming circuit connected to the input transistor, the adaptive skimming circuit comprising an integration capacitor for storing a charge proportional to an amount of incident light on the photodetector; and
    a switched-capacitor low-pass filter connected to an output of the input transistor;
    wherein the switched-capacitor low-pass filter increases a dynamic range of the circuit.

7. An amplifier circuit for coupling infrared (IR) detectors to multiplexing readouts, the circuit comprising:
    detector means for converting incident light to an input electric signal;
    signal input means for transferring the input electric signal from the detector means;
    storage means for storing a charge from the detector; and
    skimming means for skimming off a predetermined level of the input electrical signal; and
    low pass filter means for increasing a dynamic range of the amplifier circuit.

8. An amplifier circuit for coupling infrared (IR) detectors to multiplexing readouts, the circuit comprising:
    an input transistor;
    a detector coupled to a source of the input transistor;
    an adaptive skimming circuit connected to the input transistor, comprising an integration capacitor;
    a first switch transistor having a source connected to the drain of the input transistor;
    a second switch transistor having a source connected to a drain of the first switch transistor, and a drain connected to an output node;
    a filter capacitor having a node connected to the drain of the first switch capacitor; and an output capacitor having a node connected to the drain of the second switch capacitor.

9. The circuit of claim 8, further comprising a source follower transistor having a source connected to the drain of the input transistor.

10. The circuit of claim 9, wherein the integration capacitor is formed from a MOSFET transistor.

11. The circuit of claim 10, further comprising a negative feedback amplifier connected between the photodetector and the input transistor, wherein the photodetector is a low impedance detector.

* * * * *